United States Patent [19]
Onodera et al.

[11] Patent Number: 5,247,542
[45] Date of Patent: Sep. 21, 1993

[54] QPSK POWER AMPLIFIER DISTORTION CORRECTION SYSTEM

[75] Inventors: Tetsuo Onodera; Eiichi Nakanishi, both of Tokyo, Japan

[73] Assignee: Oki Electric Industry Co., Ltd., Tokyo, Japan

[21] Appl. No.: 682,235

[22] Filed: Apr. 9, 1991

[30] Foreign Application Priority Data

Apr. 23, 1990 [JP] Japan .................................. 2-105401

[51] Int. Cl.⁵ .......................................... H04L 27/20
[52] U.S. Cl. ........................................ 375/60; 375/67; 330/254; 332/103; 332/162
[58] Field of Search ......................... 375/60, 67, 39, 54; 455/116, 110, 42; 330/253, 254; 332/103, 159, 162, 144, 145

[56] References Cited

U.S. PATENT DOCUMENTS 4,565,980  1/1986  Ashida .............................. 375/67 X
4,940,954  7/1990  Aubert et al. ..................... 375/67 X Primary Examiner—Curtis Kuntz
Assistant Examiner—Tesfalbet Bocure
Attorney, Agent, or Firm—Spencer, Frank & Schneider

[57] ABSTRACT

A quadrature phase-shift keying modulator produces a QPSK signal which is amplified by a power amplifier. The amplitude gain of the power amplifier is controlled in response to an amplitude difference between the QPSK signal output by the modulator and the amplified QPSK signal output by the power amplifier. A phase detector, connected in series between the modulator and the power amplifier, eliminates amplitude variations from the QPSK signal prior to amplification. A voltage-controlled phase shifter, connected in series between the phase detector and the power amplifier, shifts the QPSK signal in phase by an amount responsive to amplitude information in the QPSK signal.

20 Claims, 4 Drawing Sheets

QPSK POWER AMPLIFIER DISTORTION CORRECTION SYSTEM

BACKGROUND OF THE INVENTION

This invention relates to a system for correcting distortion in a power amplifier, more particularly in a power amplifier used in digital mobile communications equipment to amplify a signal modulated by quadrature phase-shift keying (QPSK).

Band-limited QPSK modulation has been employed in recent digital mobile communications systems to utilize the available frequency spectrum more efficiently. In such QPSK systems the output of the modulator contains both amplitude and phase information. Because of its high-power output, the last-stage power amplifier in the transmitter has a non-linear amplitude characteristic, and the phase of the amplified output moreover shifts by an amount that varies with the amplitude. The QPSK signal that emerges from the power amplifier is accordingly distorted in both phase and amplitude. The phase distortion is particularly large in conventional power amplifiers employing bipolar transistors. Various systems for correcting the phase and amplitude distortion by means of negative feedback loops have been proposed.

One such system, described in the 1989-*nen Denshi Joho Tsushin Gakkai Shuki Zenkoku Taikai B*540 (Papers from the 1989 Autumn Meeting of the Institute of Electronics, Information and Communication Engineers of Japan, B540), prevents amplitude distortion by detecting the difference between the amplitudes of the amplified and unamplified QPSK signals and controlling the amplitude gain of the power amplifier accordingly. Phase distortion is corrected by detecting the phase difference between the amplified and unamplified QPSK signals and controlling a voltage-controlled oscillator, the output of which is fed to the power amplifier to be amplified. This system is extremely expensive because it requires three oscillators: one to generate the original carrier signal, another to convert the frequency of the amplified QPSK signal to the frequency of the QPSK signal produced by the modulator so that their phases can be compared, and the voltage-controlled oscillator mentioned above.

Another system, described in 1989-*nen Denshi Joho Tsushin Gakkai Shuki Zenkoku Taikai B*541 (Papers from the 1989 Autumn Meeting of the Institute of Electronics, Information, and Communication Engineers of Japan, B541), demodulates the amplified QPSK signal and adjusts the modulating inputs to the modulator according to the demodulated signal. In this case the feedback loop delay characteristic must be flat throughout the transmitting frequency band. This leads to problems of filtering: if a passband filter is provided in the feedback loop, as is desirable to ensure separation of transmit and receive frequencies, the complex delay characteristics of the filter must be compensated for. If the filter is located on the output side of the amplifier, however, it must have extremely strong stopband attenuation characteristics. In either case expensive components are required, and the size and complexity of the feedback loop makes it difficult to test the modulator, power amplifier, and other parts of the loop individually.

SUMMARY OF THE INVENTION

It is accordingly an object of the present invention to provide a simple, inexpensive system of correcting distortion in a QPSK transmitter.

Another object of the invention is to enable the characteristics of a QPSK modulator and power amplifier to be tested independently.

Yet another object of the invention is to enable a passband filter to be inserted between the modulator and power amplifier.

The invented system comprises a quadrature phase-shift keying modulator for producing a QPSK signal, and a power amplifier for receiving and amplifying the QPSK signal. The amplitude gain of the power amplifier is controlled according to an amplitude difference between the QPSK signal output by the modulator and the amplified QPSK signal output by the power amplifier.

A phase detector, connected in series between the modulator and the power amplifier, eliminates amplitude variations from the QPSK signal prior to amplification. A voltage-controlled phase shifter, connected in series between the phase detector and the power amplifier, shifts the QPSK signal in phase by an amount responsive to the amplitude of the QPSK signal output by the modulator, or the amplitude of the amplified QPSK signal output by the power amplifier, or the difference between these two amplitudes.

DETAILED DESCRIPTION OF THE INVENTION

A novel system for correcting distortion in a digital mobile communications system will be described with reference to the drawings. These drawings are shown to illustrate the invention but not to limit the scope of the invention, which should be determined solely from the attached claims.

Figure 1:
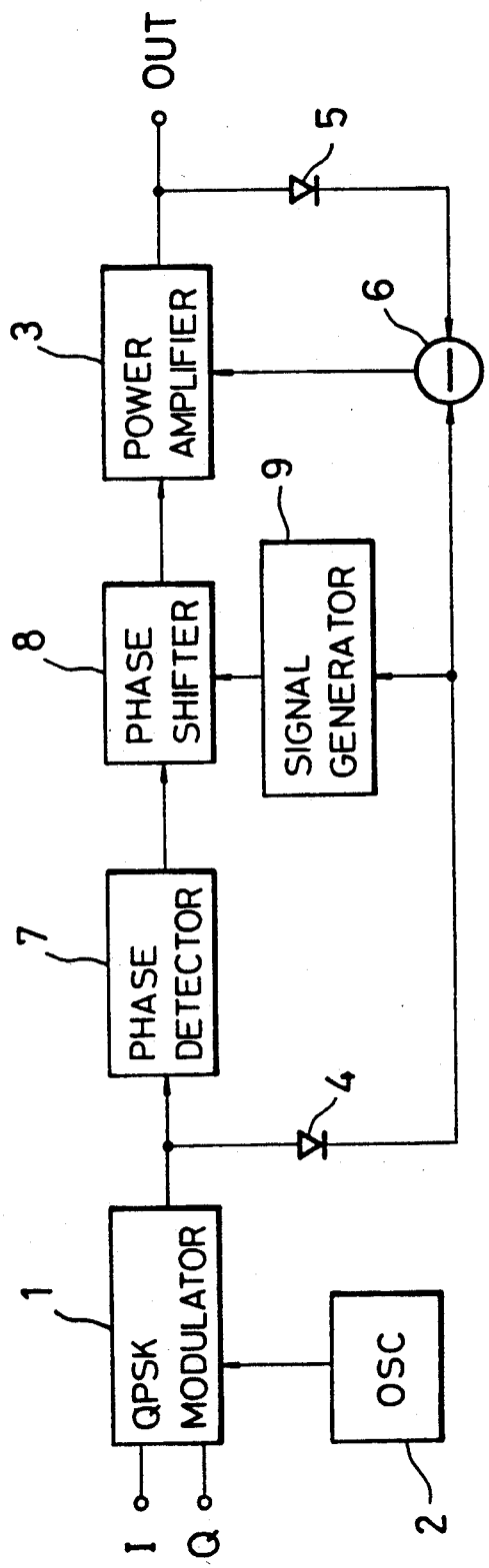
FIG. 1 is a block diagram illustrating a novel system for correcting distortion in a QPSK power amplifier.

With reference to FIG. 1, the basic elements of the communications system are a quadrature phase-shift keying modulator 1, an oscillator 2, and a power amplifier 3. The modulator 1 receives a carrier signal produced by the oscillator 2 and modulates it according to I and Q input signals (which originate from an external device not shown in the drawing), thus generating a QPSK signal. The power amplifier 3 amplifies the QPSK signal to generate an amplified QPSK signal, which is supplied to an output terminal marked OUT in the drawings.

The distortion-correcting system in FIG. 1 comprises a pair of amplitude detectors 4 and 5, a differential amplifier 6, a phase detector 7, a voltage-controlled phase shifter 8, and a phase-correcting signal generator 9. These elements are interconnected as follows. The QPSK signal generated by the modulator 1 is fed to the first amplitude detector 4 and the phase detector 7. The output of the first amplitude detector 4 is fed to the phase-correcting signal generator 9 and the differential amplifier 6. The outputs of the phase detector 7 and the phase-correcting signal generator 9 are both fed to the voltage-controlled phase shifter 8. The outputs of the voltage-controlled phase shifter 8 and the differential amplifier 6 are both fed to the power amplifier 3. The output of the power amplifier 3 is fed not only to the output terminal marked OUT but also to the second amplitude detector 5. The output of the second amplitude detector 5 is fed to the differential amplifier 6.

The modulator 1 and the oscillator 2 are well-known devices, detailed descriptions of which will be omitted. The amplitude detectors 4 and 5 are diodes that rectify their respective input signals, thus filtering out the ac carrier component and producing a dc signal that contains the amplitude information of the input. The signal produced by the first amplitude detector 4 will be referred to as the first amplitude signal; the signal produced by the second amplitude detector 5 will be referred to as the second amplitude signal. The differential amplifier 6 is a familiar type of operational amplifier that receives the first and second amplitude signals and detects their difference, thus producing an amplitude difference signal.

The phase-correcting signal generator 9 generates a phase-correcting signal the voltage of which depends on the first amplitude signal received from the first amplitude detector 4. The dependence is arranged to compensate for the phase distortion characteristics of the power amplifier 3 and the phase detector 7. The phase-correcting signal generator 9 is designed by investigating the relationship between amplitude variations in the output of the modulator 1 and phase distortion generated by the power amplifier 3 and the phase detector 7. In many cases the phase-correcting signal can be a linear function of the first amplitude signal, as will be shown later.

The phase detector 7 has a limiter circuit that removes amplitude variations from the QPSK signal received from the modulator 1 but preserves phase information, thus generating a phase-detected signal. The voltage-controlled phase shifter 8 shifts the phase of the phase-detected signal by a certain amount, this amount being controlled by the phase-correcting signal received from the phase-correcting signal generator 9. Various means of implementing the voltage-controlled phase shifter 8 are possible. For example, if the required correction is small, a varactor diode can be used to alter the phase of a tuning circuit. If a larger correction is required, a well-known method is to alter the mixing ratio of two signals having different phases.

The power amplifier 3 is a well-known device that has both power amplifying and amplitude modulating functions. The amplitude gain of the power amplifier 3 is controlled by the amplitude difference signal received from the differential amplifier 6. The amplifying element in the power amplifier 3 is a gallium-arsenide field-effect transistor (GaAs FET).

Next the operation of the circuit in FIG. 1 will be described. More specifically, the following description will explain how phase information and amplitude information are transferred from the modulator 1 to the amplified QPSK signal, and how phase and amplitude distortion are corrected.

Phase information in the QPSK signal output by the modulator 1 is preserved by the phase detector 7 and the power amplifier 3, but with slight distortion by the phase detector 7 and a greater degree of distortion by the power amplifier 3. The amount of phase distortion introduced by the power amplifier 3 depends on the amplitude of the QPSK signal. This amplitude is known, however, to the phase-correcting signal generator 9. The phase-correcting signal generator 9 instructs the voltage-controlled phase shifter 8, by means of the phase-correcting signal, to shift the phase of the phase-detected signal by an amount that substantially compensates for the distortion introduced by the power amplifier 3, and also, if necessary, for distortion introduced by other components such as the phase detector 7.

Amplitude information is lost when the QPSK signal passes through the phase detector 7, but in the meantime the amplitude information has been detected by the first amplitude detector 4. By comparing this amplitude information with the amplitude of the amplified QPSK signal, as detected by the second amplitude detector 5, and controlling the amplitude gain of the power amplifier 3 according to the amplitude difference, the differential amplifier 6 forces the amplified QPSK signal output by the power amplifier 3 to track amplitude changes in the original QPSK signal output by the modulator 1. That is, instead of relying on the power amplifier's own amplitude gain characteristic, which is non-linear and hence distorting, the system in FIG. 1 uses a feedback control loop to ensure that amplitude information is reproduced accurately, without distortion.

The system in FIG. 1 thus creates an amplified QPSK output signal that is substantially free of both phase and amplitude distortion and is suitable for use in digital mobile communications systems.

Figure 2:
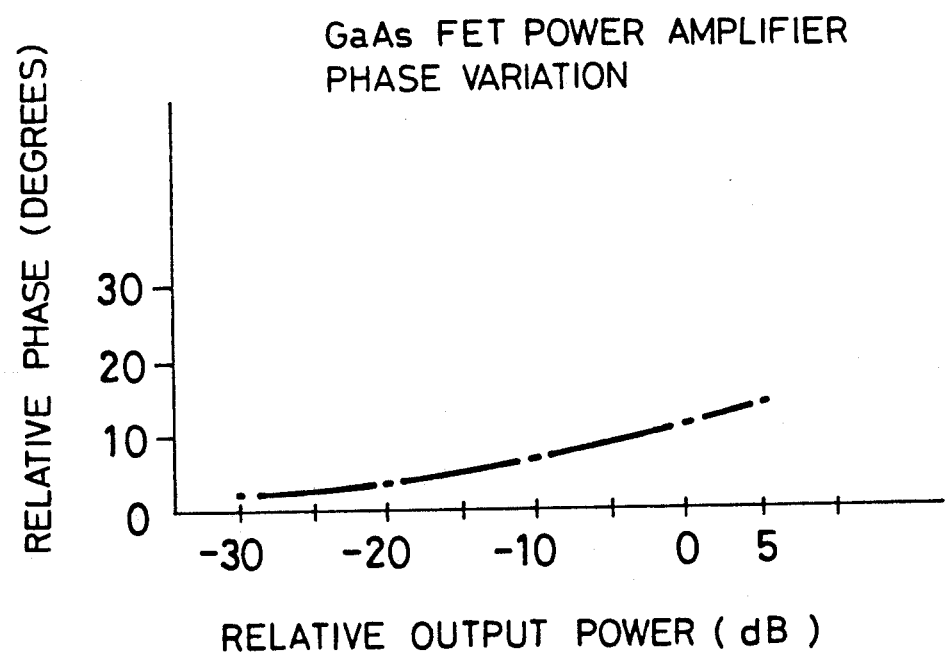
FIG. 2 is a graph illustrating the phase variation characteristic of a gallium-arsenide field-effect transistor amplifier element.

FIG. 2 shows an example of the phase distortion characteristic of a GaAs FET of the type used in the power amplifier 3. Output power is shown on the horizontal axis and output phase on the vertical axis. A variation of approximately 15° in phase can be seen to occur over the total range of variation of output power.

The phase distortion characteristic of the phase detector 7 will not be illustrated because it can, by suitable circuit design, be reduced to a value much smaller than the distortion generated in the power amplifier 3. If the mobile communications system can tolerate a total phase error of up to about 5°, the phase-correcting signal generator 9 can be realized in a simple way by a circuit that provides a linear approximation to the curve in FIG. 2.

In the prior art, field-effect transistors were not used as power amplifier elements, due to their higher cost as compared with bipolar silicon transistors. Field-effect transistors, however, and GaAs FETs in particular, exhibit much less phase variation as a function of output power than do bipolar silicon transistors. The system shown in FIG. 1 enables distortion to be corrected at a very reasonable total cost when a GaAs FET amplifier element is used.

If phase variation can be reduced to a level lower than shown in FIG. 2 by optimizing the amplifier element design and circuit configuration of the power amplifier 3, the structure of the phase-correcting signal generator 9 can be simplified accordingly, providing further cost advantages.

A power amplifier of the type employed in FIG. 1 usually has a power control circuit (not indicated in the drawing) for stepwise power control of the output. One part of the power control circuit is an amplitude feedback path. If this existing feedback path can be employed in place of the second amplitude detector 5 and the differential amplifier 6 in FIG. 1, the novel system can correct amplitude distortion at an extremely low cost. If necessary, the amplitude control loop in FIG. 1 may also comprise a circuit for compensating for the phase of the loop.

The simple structure of the feedback loop in FIG. 1 makes it easy to test the characteristics of the modulator 1 and the power amplifier 3 separately. In addition, a bandpass filter can be inserted between the modulator 1 and the point at which the QPSK signal branches to the first amplitude detector 4 and the phase detector 7. Located here, the filter does not have stringent attenuation requirements, and can reject unwanted frequency components without causing delays that interfere with phase control. Thus a simple filter can be used, for example, to ensure separation of transmit and receive frequencies.

Figure 3:
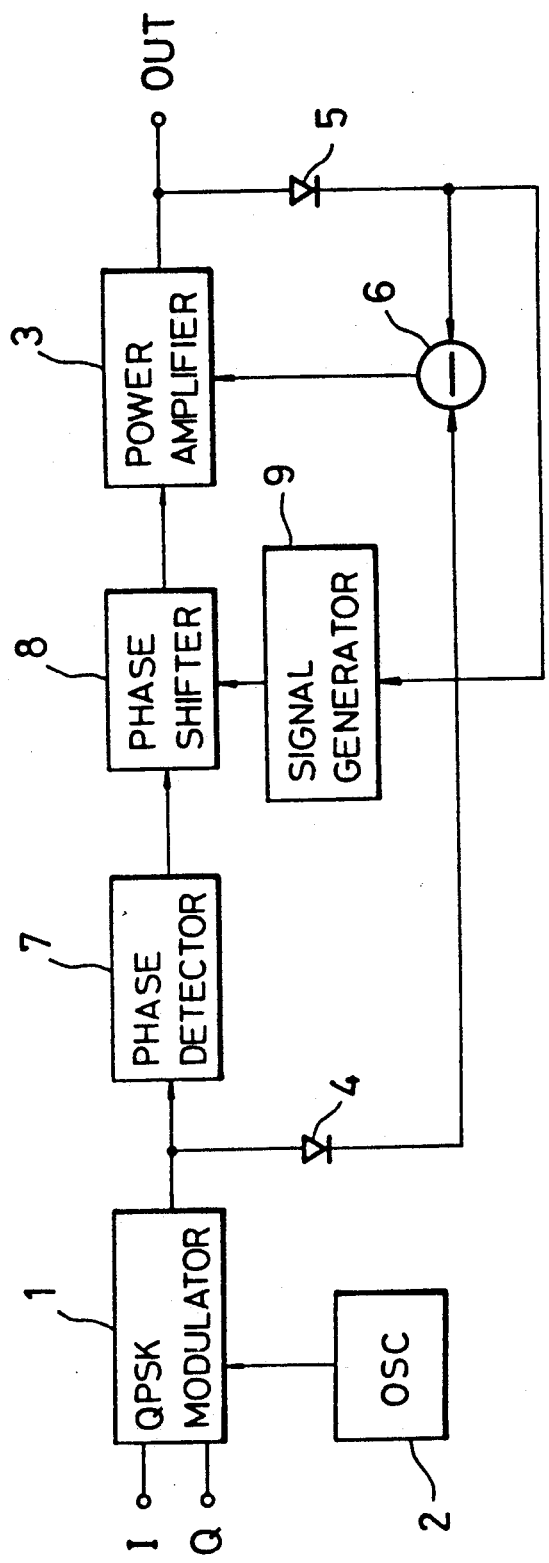
FIG. 3 is a block diagram illustrating another novel system for correcting distortion in a QPSK power amplifier.
Figure 4:
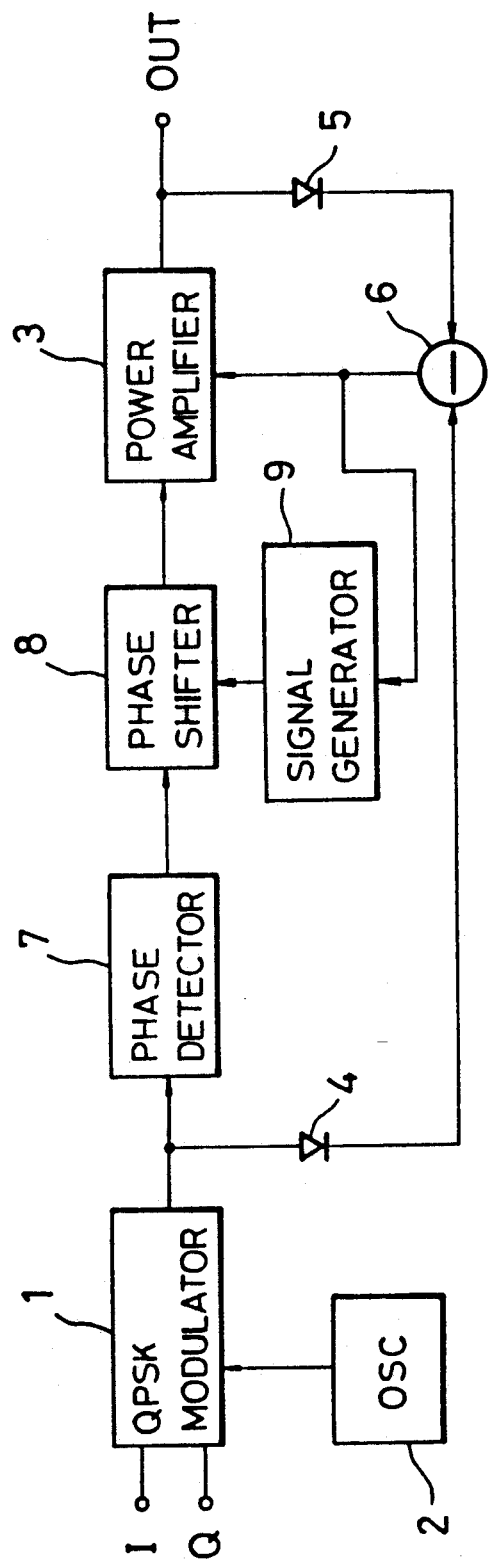
FIG. 4 is a block diagram illustrating yet another novel system for correcting distortion in a QPSK power amplifier.

Next two variations of the system shown in FIG. 1 will be described with reference to FIGS. 3 and 4. The same reference numerals are used in all three drawings. The system in FIG. 3 is identical to the system in FIG. 1 except that the second amplitude signal generated by the second amplitude detector 5 is employed as the input to the phase-correcting signal generator 9. The system in FIG. 4 is identical to the system in FIG. 1 except that the amplitude difference signal generated by the differential amplifier 6 is input to the phase-correcting signal generator 9. The systems in FIGS. 1, 3, and 4 all operate in essentially the same way and provide the same benefits. For input to the phase-correcting signal generator 9, the circuit designer can select whichever of the three signals offers the greatest simplicity of design, or the best phase distortion correction.

The circuits shown in FIGS. 1, 3, and 4 can be modified in various ways that will be apparent to one skilled in the art without departing from the spirit and scope of the invention. For example, instead of a GaAs FET, other FET amplifier elements, or elements having FET-like characteristics, may be used in the power amplifier 3.

What is claimed is:

1. A system for correcting distortion in a digital mobile communications power amplifier, comprising:
   an oscillator for generating a carrier signal;
   a quadrature phase-shift keying modulator for receiving said carrier signal and modulating it in response to input signals, thus producing a QPSK signal;
   a power amplifier for receiving and amplifying said QPSK signal, said power amplifier having an amplitude gain which is responsive to a control signal;
   gain control means for generating a signal corresponding to an amplitude difference between the QPSK signal output by said modulator and the amplified QSPK signal output by said power amplifier, said signal corresponding to an amplitude difference being supplied to said power amplifier as said control signal;
   a phase detector, connected in series between said modulator and said power amplifier, for eliminating amplitude variations from said QPSK signal prior to amplification; and
   a voltage-controlled phase shifter, connected in series between said phase detector and said power amplifier, for phase shifting the QPSK signal from which amplitude variations have been eliminated by an amount which is a function of amplitude information in said QPSK signal.

2. The system of claim 1, wherein said voltage-controlled phase shifter shifts the phase of the QPSK signal from which amplitude variations have been eliminated by an amount responsive to the amplitude of the QPSK signal output by said modulator.

3. The system of claim 1, wherein said voltage-controlled phase shifter shifts the phase of the QPSK signal from which amplitude variations have been eliminated by an amount responsive to the amplitude of the amplified QPSK signal output by said power amplifier.

4. The system of claim 1, wherein said voltage-controlled phase shifter shifts the phase of the QPSK signal from which amplitude variations have been eliminated by an amount responsive to the amplitude difference between the QPSK signal output by said modulator and the amplified QPSK signal output by said power amplifier.

5. The system of claim 1, wherein said power amplifier has a field-effect transistor amplifier element.

6. The system of claim 1, wherein said power amplifier has a gallium-arsenide field-effect transistor amplifier element.

7. A system for correcting distortion in a digital mobile communications power amplifier, comprising:
   an oscillator for generating a carrier signal;
   a quadrature phase-shift keying modulator for receiving said carrier signal and modulating it in response to input signals, thus producing a QPSK signal;
   a first amplitude detector for receiving and amplitude-detecting said QPSK signal, thus producing a first amplitude signal;
   a phase detector for receiving and phase-detecting said QPSK signal, thus producing a phase-detected signal;
   a voltage-controlled phase shifter for receiving said phase-detected signal and shifting said phase-detected signal in phase by an amount responsive to a phase-correcting signal, thus producing a phase-shifted signal;
   a power amplifier for receiving and amplifying said phase-shifted signal with an amplitude gain controlled by an amplitude difference signal, thus producing an amplified QPSK signal;
   a second amplitude detector for receiving and amplitude-detecting said amplified QPSK signal, thus producing a second amplitude signal;
   a differential amplifier for receiving said first amplitude signal and said second amplitude signal and detecting a difference therebetween, thus producing said amplitude difference signal; and
   a phase-correcting signal generator for receiving said first amplitude signal and generating said phase-correcting signal therefrom.

8. The system of claim 7, wherein said phase-correcting signal is linearly related in voltage to said first amplitude signal.

9. The system of claim 8, wherein said power amplifier has a power control circuit comprising an amplitude feedback loop, and said second amplitude detector and said differential amplifier are also used as part of said amplitude feedback loop.

10. A system for correcting distortion in a digital mobile communications power amplifier, comprising:
    an oscillator for generating a carrier signal;
    a quadrature phase-shift keying modulator for receiving said carrier signal and modulating it in response to input signals, thus producing a QPSK signal;

a first amplitude detector for receiving and amplitude-detecting said QPSK signal, thus producing a first amplitude signal;

a phase detector for receiving and phase-detecting said QPSK signal, thus producing a phase-detected signal;

a voltage-controlled phase shifter for receiving said phase-detected signal and shifting said phase-detected signal in phase by an amount responsive to a phase-correcting signal, thus producing a phase-shifted signal;

a power amplifier for receiving and amplifying said phase-shifted signal with an amplitude gain controlled by an amplitude difference signal, thus producing an amplified QPSK signal;

a second amplitude detector for receiving and amplitude-detecting said amplified QPSK signal, thus producing a second amplitude signal;

a differential amplifier for receiving said first amplitude signal and said second amplitude signal and detecting a difference therebetween, thus producing said amplitude difference signal; and a phase-correcting signal generator for receiving said second amplitude signal and generating said phase-correcting signal therefrom.

11. The system of claim 10, wherein said phase-correcting signal is linearly related in voltage to said second amplitude signal.

12. The system of claim 10, wherein said power amplifier has a power control circuit comprising an amplitude feedback loop, and said second amplitude detector and said differential amplifier are also used as part of said amplitude feedback loop.

13. A system for correcting distortion in a digital mobile communications power amplifier, comprising:

an oscillator for generating a carrier signal;

a quadrature phase-shift keying modulator for receiving said carrier signal and modulating it in response to input signals, thus producing a QPSK signal;

a first amplitude detector for receiving and amplitude-detecting said QPSK signal, thus producing a first amplitude signal;

a phase detector for receiving and phase-detecting said QPSK signal, thus producing a phase-detected signal;

a voltage-controlled phase shifter for receiving said phase-detected signal and shifting said phase-detected signal in phase by an amount responsive to a phase-correcting signal, thus producing a phase-shifted signal;

a power amplifier for receiving and amplifying said phase-shifted signal with an amplitude gain controlled by an amplitude difference signal, thus producing an amplified QPSK signal;

a second amplitude detector for receiving and amplitude-detecting said amplified QPSK signal, thus producing a second amplitude signal;

a differential amplifier for receiving said first amplitude signal and said second amplitude signal and detecting a difference therebetween, thus producing said amplitude difference signal; and a phase-correcting signal generator for receiving said amplitude difference signal and generating said phase-correcting signal therefrom.

14. The system of claim 13, wherein said phase-correcting signal is linearly related in voltage to said amplitude difference signal.

15. The system of claim 13, wherein said power amplifier has a power control circuit comprising an amplitude feedback loop, and said second amplitude detector and said differential amplifier are also used as part of said amplitude feedback loop.

16. A system for correcting distortion in a radio transmitter, comprising:

an oscillator for generating a carrier signal;

a quadrature phase-shift keying modulator for receiving said carrier signal and modulating it in response to input signals, thus producing a QPSK signal;

a power amplifier having an input port, an output port, and a control port to receive a control signal which controls the amplitude gain of the power amplifier;

means for conveying the QPSK signal from the modulator to the input port of the amplifier, the means for conveying including
phase detector means for eliminating amplitude variations from the QPSK signal, and
a phase shifter coupled between the phase detector means and the input port of the amplifier;

a first amplitude detector connected to the output port of the amplifier; and means, connected to the first amplitude detector, for generating the control signal supplied to the control port of the amplifier.

17. The system of claim 16, further comprising a second amplitude detector that is connected to the means for conveying the QPSK signal, and wherein the means for generating the control signal is additionally connected to the second amplitude detector.

18. The system of claim 18, wherein the first amplitude detector generates a first amplitude signal, wherein the second amplitude detector generates a second amplitude signal, and wherein the means for generating the control signal comprises means for finding the difference between the first and second amplitude signals.

19. The system of claim 17, wherein the phase shifter is a voltage-controlled phase shifter having a control port, and further comprising means connected to one of the amplitude detectors for generating a control signal which is supplied to the control port of the voltage-controlled phase shifter.

20. The system of claim 16, wherein the phase shifter is a voltage-controlled phase shifter having a control port, and further comprising means for connected the control port of the amplifier to the control port of the voltage-controlled phase shifter.

* * * * *